(12) United States Patent
Tasher

(10) Patent No.: US 9,448,880 B2
(45) Date of Patent: Sep. 20, 2016

(54) STORAGE DEVICE WITH ROBUST ERROR CORRECTION SCHEME

(71) Applicant: WINBOND ELECTRONICS CORPORATION, Taichung (TW)

(72) Inventor: Nir Tasher, Tel Mond (IL)

(73) Assignee: WINBOND ELECTRONICS CORPORATION, Taichung (TW)

(*) Notice: Subject to any disclaimer, the term of this patent is extended or adjusted under 35 U.S.C. 154(b) by 107 days.

(21) Appl. No.: 14/608,213

(22) Filed: Jan. 29, 2015

(65) Prior Publication Data

US 2016/0224417 A1    Aug. 4, 2016

(51) Int. Cl.
*H03M 13/00* (2006.01)
*G06F 11/10* (2006.01)
*G11C 29/52* (2006.01)

(52) U.S. Cl.
CPC ........... *G06F 11/1068* (2013.01); *G11C 29/52* (2013.01)

(58) Field of Classification Search
CPC ............... G06F 11/10; G06F 11/1048; G06F 11/1072; G06F 11/08; G06F 11/1068
See application file for complete search history.

(56) References Cited

U.S. PATENT DOCUMENTS

| | | | | | |
|---|---|---|---|---|---|
| 5,754,567 | A | * | 5/1998 | Norman | G06F 11/1068 365/185.09 |
| 8,179,719 | B1 | * | 5/2012 | Yang | G11C 8/10 365/185.03 |

* cited by examiner

*Primary Examiner* — Shelly A Chase
(74) *Attorney, Agent, or Firm* — Soroker Agmon Nordman

(57) ABSTRACT

A method of enhancing error correction in a data storage system, including receiving a data storage system having one or more rows each row having: a set of data bits including a word of data, a first set of error correction bits and a second set of error correction bits or a flag bit or both; each bit can be in a first state or a second state; wherein initially all the bits are in the first state; writing data in a word in the data storage system by changing bits from the first state to the second state; creating an error correction code for the word and writing it to the first set of error correction bits; when needing to update the word using the second set of error correction bits and/or the flag bit to reduce the need to rewrite the word because of the error correction code.

17 Claims, 7 Drawing Sheets

STORAGE DEVICE WITH ROBUST ERROR CORRECTION SCHEME

TECHNICAL FIELD

The present disclosure relates generally to implementing an error correction code (ECC) in a flash device to increase reliability of the memory device.

BACKGROUND

Non-volatile memory or non-volatile storage is computer memory which retains stored information even when it is not powered. Examples of non-volatile memory include read-only memory, flash memory, ferroelectric RAM (F-RAM), and different types of magnetic computer storage devices such as hard disks, floppy disks, and magnetic tape, optical discs. Non-volatile memory is typically used for long-term persistent storage.

Flash memory devices are electronic non-volatile computer storage media that allow accessing or reading stored data, writing new data and erasing stored data. In recent years, due to the overwhelming advantage of large memory size and high rewriting speed, flash memory has played a major role in the non-volatile memory market. Flash memories are used in a variety of applications, for example in USB drives for personal information storage, or embedded in credit cards or gift cards to enable financial payments or transactions. Generally flash memory is used especially for application in which the data is rarely changed but read many times, since they can be read faster than they can be written.

Typically two types of technology are used to manufacture flash memory: NAND and NOR. NAND flash memory is generally characterized by having long rows of bits and they are written a row at a time. To change even a single bit the entire row must be read to a buffer, amended and then written back. In contrast the NOR flash memory technology allows writing the value '0' (zero) to any physical bit address in the storage device, and setting the values to '1' (one) when erasing a sector which includes a plurality of bits (e.g. one or more rows). Generally a flash memory is initialized with the value of '1' (one) in all the bits, so that an application can easily write initial data by changing '1' bits to zeros. Changing zero bits to ones is a slower and more complex process typically requiring backing up the current information of an entire sector to a work memory, correcting the desired bits, erasing the sector in the flash memory by initializing it to ones and changing selected bits to zero based on the modified content of the work memory.

Generally in a flash memory the stored data remains intact between instances of device usage. However, natural degradation, external radiation or magnetic fields may corrupt the values stored in the flash memory. For some applications, such as automotive control applications, financial transactions or medical applications, it is of significant importance to provide storage devices that are reliable, e.g. that indicate whether the stored data is incorrect or corrupted.

Typically adding extra memory bits for every word in the flash memory to implement an error correction code can reduce vulnerability to errors. However this generally requires that for every bit change in a word, the error correction bits need to be rewritten, so that even simple bit changes from one to zero may require using the slower process of erasing and then rewriting an entire sector.

It is desirable to provide a storage device, for example flash-memory based with an error correction scheme that reduces the need to rewrite entire sectors of data for every simple bit change from one to zero, because of the error correction code.

SUMMARY

An aspect of an embodiment of the disclosure relates to a system and method of enhancing error correction in a data storage system. The data storage system having words of data made up from a sequence of bits and each word having one or more sets of bits associated with it for implementing an error correction scheme for the word. Each bit can be in a first state or a second state, wherein a single bit can be changed from the first state to the second state but changing a bit from the second state to the first state requires rewriting the entire word and associated bits or even a group of words and associated bits (e.g. a sector). When updating a word that only requires toggling bits from the first state to the second state it is possible that an entire sector will need to be rewritten because of the need to update the error correction bits that are calculated from the word. The error correction bits might need to be toggled from the second state to the first state even though the word was only changed by toggling bits from the first state to the second state. The current disclosure provides a solution to maintain a workable data storage system while reducing the need for rewriting an entire sector because of an update to the error correction bits.

In an exemplary embodiment of the disclosure, the data storage system includes an additional set of error correction bits for each word and supports a method of determining which set of error correction bits is the correct one. Optionally, the data storage system may include more than one additional set of error correction bits.

There is thus provided according to an exemplary embodiment of the disclosure, a method of enhancing error correction in a data storage system, comprising:

receiving a data storage system having one or more rows each row having: a set of data bits including a word of data, a first set of error correction bits and a second set of error correction bits or a flag bit or both; each bit can be in a first state or a second state; wherein initially all the bits are in the first state;

writing data in a word in the data storage system by changing bits from the first state to the second state;

creating an error correction code for the word in the first set of error correction bits;

receiving a request to update the word by changing one or more additional bits of the word from the first state to the second state;

calculating a new error correction code for the updated word; and performing one of the following options:

a) writing the new error correction code to the second set of error correction bits and changing the value of the flag bit from the first state to the second state; or b) writing the new error correction code to the second set of error correction bits and changing the value of all the bits of the first set of error correction bits to the second state; or c) discarding the new error correction code and changing the value of the flag bit from the first state to the second state; or d) determining if the new error correction code only requires changing bits of the first set of error correction bits from the first state to the second state, and updating the first set of error correction bits if the determination is positive.

In an exemplary embodiment of the disclosure, the method further comprises:

reading data of a word from the data storage system;

selecting a set of error correction bits based on the content of the flag bit or the content of the first set of error correction bits;

performing error correction if a valid error correction code is available in the first set of error correction bits or in the second set of error correction bits;

if error correction is successful providing corrected data instead of the data from the word;

otherwise if error correction is unsuccessful providing the data from the word.

Optionally, the method further comprising providing an indicator whether the provided data from the word was corrected successfully, or not corrected due to failure, lack of error in the original word, or lack of valid error correction bits.

In an exemplary embodiment of the disclosure, the selecting comprises using the first set of error correction bits if the flag bit is in the first state and using the second set of error correction bits if the flag is in the second state. Alternatively or additionally, selecting comprises using the second set of error correction bits if all the bits of the first error correction bits are in the second state, otherwise using the first set of error correction bits. Further alternatively or additionally, the selecting comprises using the second set of error correction bits if all the bits of the first error correction bits are in the second state and not all of the bits of the second set of error correction bits are in the first state, otherwise using the first set of error correction bits. Further alternatively or additionally, the selecting comprises using the first set of error correction bits if the flag bit is in the first state and the second set of error correction bits does not exist, otherwise if the flag bit is in the second state not performing error correction.

In an exemplary embodiment of the disclosure, changing a bit of a word from the second state to the first state requires erasing one or more entire rows and rewriting them with the required change.

There is further provided according to an exemplary embodiment of the disclosure, a data storage system, comprising:

One or more rows each row having: a set of data bits including a word of data, a first set of error correction bits and a second set of error correction bits or a flag bit or both; each bit can be in a first state or a second state; wherein initially all bits are in the first state;

wherein the data storage system is configured to write data in a word by changing bits from the first state to the second state and then creating an error correction code for the word in the first set of error correction bits;

the data storage system is also configured to:

receive a request to update the data of the word by changing additional bits of the word from the first state to the second state;

calculate a new error correction code for the updated word; and perform one of the following options:

a) write the new error correction code to the second set of error correction bits and changing the value of the flag bit from the first state to the second state; or b) write the new error correction code to the second set of error correction bits and changing the value of all the bits of the first set of error correction bits to the second state; or c) discard the new error correction code and changing the value of the flag bit from the first state to the second state; or d) determine if the new error correction code only requires changing bits of the first set of error correction bits from the first state to the second state, and updating the first set of error correction bits if the determination is positive.

In an exemplary embodiment of the disclosure, the system is designed to enable reading data of a word and correcting the data of the word by:

selecting a set of error correction bits based on the content of the flag bit and/or the content of the first set of error correction bits;

performing error correction if a valid error correction code is available in the first set of error correction bits or the second set of error correction bits;

if error correction is successful providing corrected data instead of the data from the word;

otherwise if error correction is unsuccessful providing the data from the word.

In an exemplary embodiment of the disclosure, the system also provides an indicator whether the provided data from the word was corrected successfully, or not corrected due to failure, lack of error in the original word, or lack of valid error correction bits. Optionally, the selecting comprises using the first set of error correction bits if the flag bit is in the first state and using the second set of error correction bits if the flag is in the second state. Alternatively or additionally, selecting comprises using the second set of error correction bits if all the bits of the first error correction bits are in the second state, otherwise using the first set of error correction bits. Further alternatively or additionally, selecting comprises using the second set of error correction bits if all the bits of the first error correction bits are in the second state and not all of the bits of the second set of error correction bits are in the first state, otherwise using the first set of error correction bits. Further alternatively or additionally, selecting comprises using the first set of error correction bits if the flag bit is in the first state and the second set of error correction bits does not exist, otherwise if the flag bit is in the second state not performing error correction.

In an exemplary embodiment of the disclosure, changing a bit of a word from the second state to the first state requires erasing one or more entire rows and rewriting them with the required change. Optionally, each row comprises more than two sets of error correction bits.

BRIEF DESCRIPTION OF THE DRAWINGS

The present disclosure will be understood and better appreciated from the following detailed description taken in conjunction with the drawings. Identical structures, elements or parts, which appear in more than one figure, are generally labeled with the same or similar number in all the figures in which they appear, wherein.

DETAILED DESCRIPTION

Figure 1:
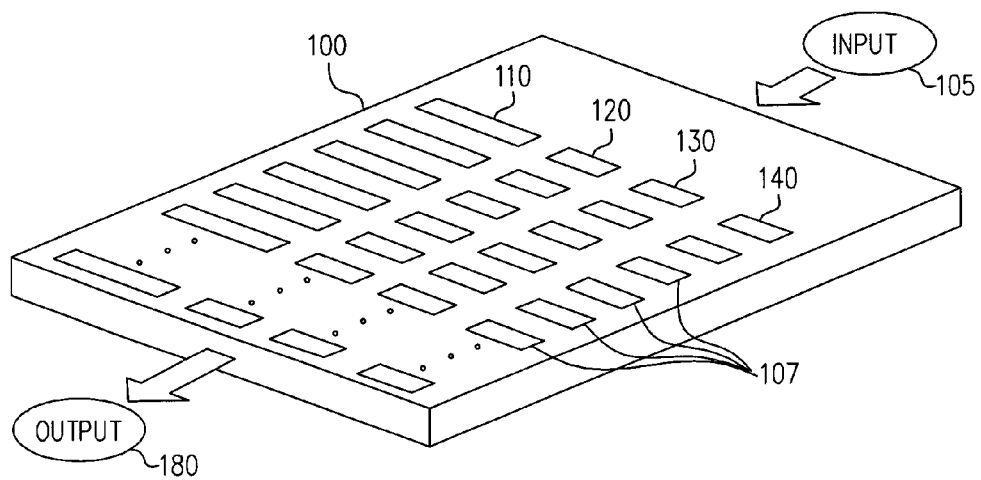
FIG. 1 is a schematic illustration of a data storage system, according to an exemplary embodiment of the disclosure.

FIG. 1 is a schematic illustration of a data storage system 100, according to an exemplary embodiment of the disclosure. Data storage system 100 is a non volatile memory such as a NOR based flash memory that is used for storing data. In an exemplary embodiment of the disclosure, data storage system 100 includes one or more rows 107, wherein each row 107 includes a word 110 having a plurality of bits, for example 32 bits, 64 bits, 128 bits, 256 bits or any number of bits. Each word may be divided into bytes of 8 bits. One or more rows may be referred to as a sector.

Optionally, each row is provided with a first set of error correction bits (ECC1) 120 for performing error correction for the bits of word 110. In some embodiments of the disclosure, the row 107 includes a second set of error correction bits (ECC2) 130. Alternatively, or additionally, the row 107 includes a flag bit 140. Typically data storage system 100 is used for applications that mainly read data and rarely update data although data storage system 100 may also be used as a non volatile read write memory that frequently reads and writes data. In an exemplary embodiment of the disclosure, data storage system 100 accepts as input 105 requests to write data in words 110 and accepts requests to read data from words 110, the data being provided as output 180. Optionally, when writing data to words 110, data storage system 100 creates error correction codes to be able to authenticate the integrity of the bits in word 110 and when reading the data, data storage system 100 verifies the integrity of the data, detects errors and optionally, corrects them while preparing the data to be provided to output 180.

In an exemplary embodiment of the disclosure, data storage system 100 is initially erased wherein all the bits are set in a first state, for example with all bits set to '1'. Optionally, a single bit can be changed from the first state (e.g. '1') to a second state (e.g. '0'), however to change a bit back from the second state to the first state requires backing up (e.g. temporarily storing) an entire row 107 or group of rows 107 (e.g. a sector), erasing the rows 107 by resetting them back to the first state and rewriting the entire row 107 or sector with the corrections. Optionally, when updating data bits of a word 110 from the first state to the second state (which do not require rewriting an entire row 107 or sector), the error correction code may require updating bits from the second state to the first state so that the entire row 107 may anyways need to be rewritten.

In an exemplary embodiment of the disclosure, data storage system 100 is designed to support use of an error correction code but yet to reduce the need to rewrite an entire row 107 or sector when only updating one or more bits of word 110 from the first state to the second state. Optionally, the error correction code is calculated from the bits of word 110 and can be used to detect or correct one or more bit errors in a word. Examples of common error correction codes known in the art are Hamming and BCH codes. For example when using 32 bit words a Hamming code requires 6 bits for error correction. The 6 bits can be used to correct a single bit error within 38 bits (32+6) and detect up to 2 errors. BCH codes require 7 additional bits and can correct 2 errors within 39 bits (32+7).

It should be noted that as stated above the first state may be represented by a bit set to a value of '1' and the second state may be represented by a bit set to the value of '0', however data storage system 100 may just as well be designed with the first state and second state represented by the opposite values, for example '0' for the first state and '1' for the second state.

Figure 2A:
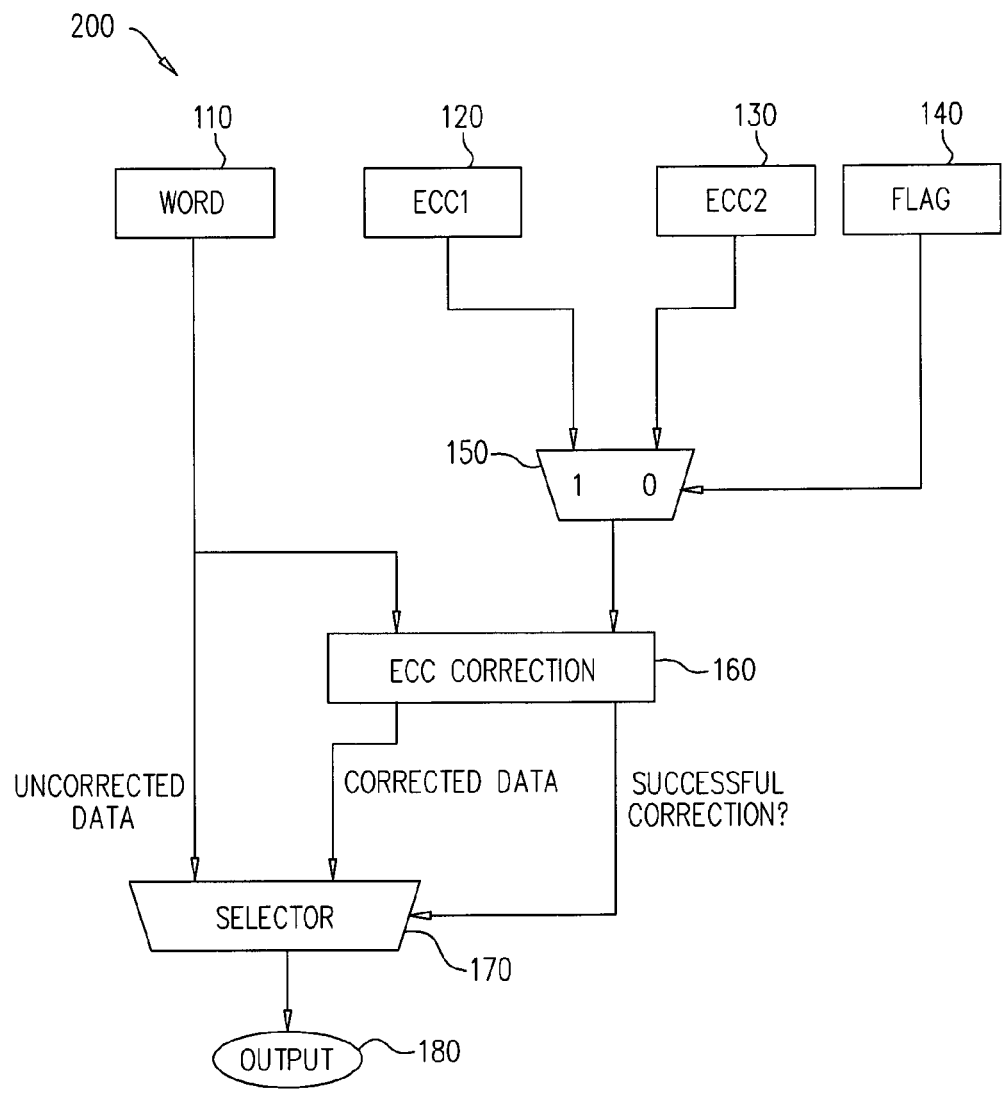
FIG. 2A is a schematic flow diagram of an implementation of a robust error correction code scheme, according to an exemplary embodiment of the disclosure.
Figure 2B:
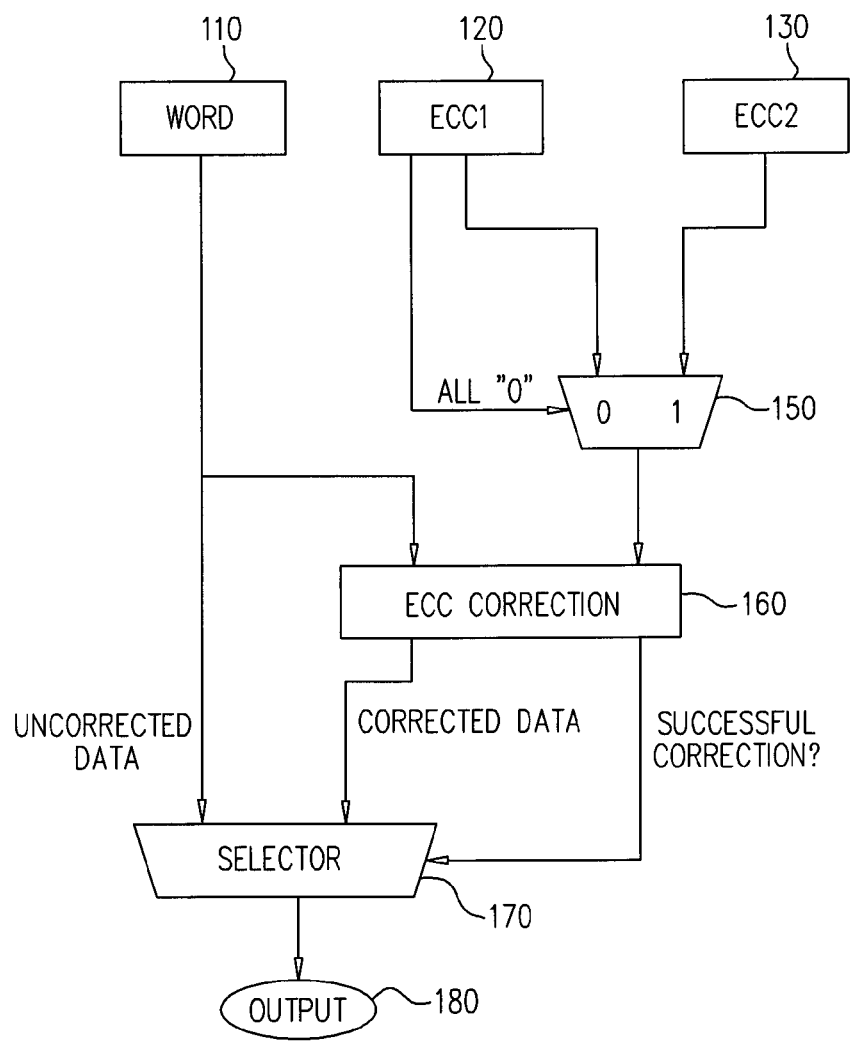
FIG. 2B is a schematic flow diagram of an alternative implementation of a robust error correction code scheme, according to an exemplary embodiment of the disclosure.
Figure 2C:
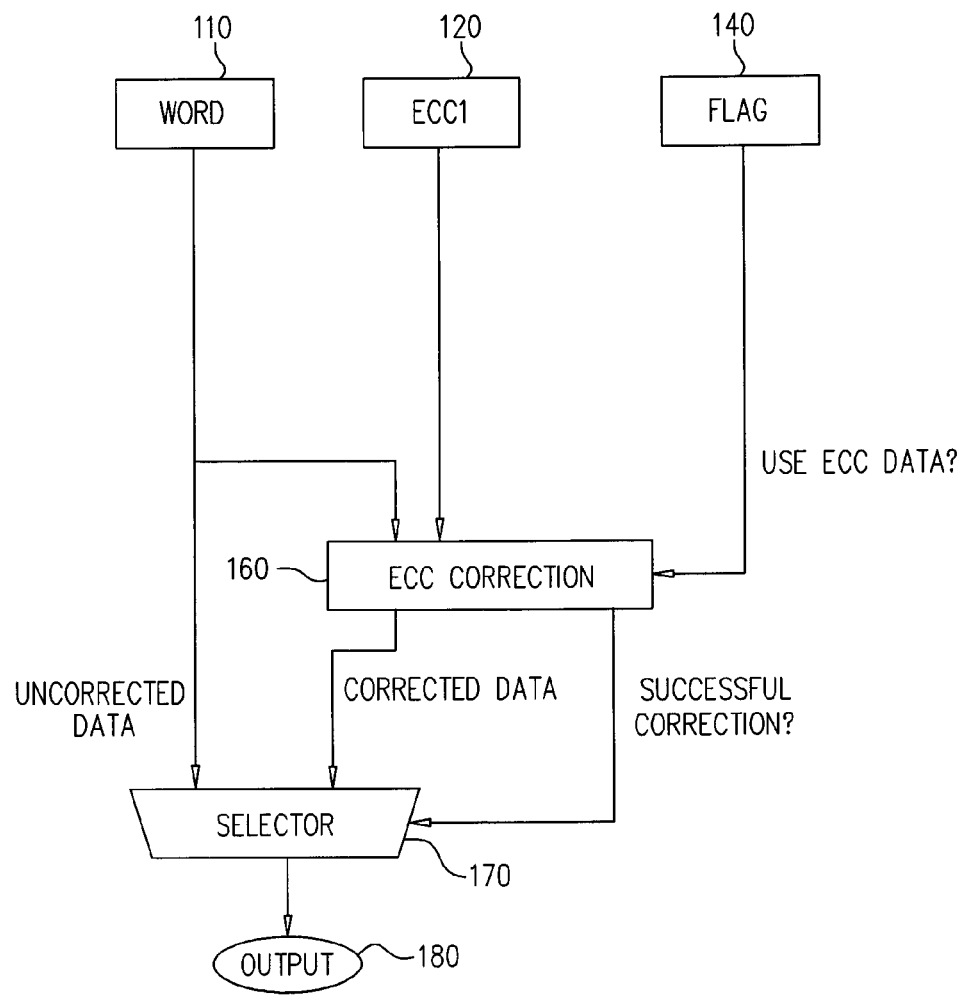
FIG. 2C is a schematic flow diagram of a further alternative implementation of a robust error correction code scheme, according to an exemplary embodiment of the disclosure.

FIG. 2A is a schematic flow diagram of an implementation of a robust error correction code scheme, FIG. 2B is a schematic flow diagram of an alternative implementation of a robust error correction code scheme, and FIG. 2C is a schematic flow diagram of a further alternative implementation of a robust error correction code scheme, according to an exemplary embodiment of the disclosure. In the scheme shown in FIG. 2A data storage system 100 uses the first set of error correction bits (ECC1) 120, the second set of error correction bits (ECC2) 130 and the flag bit 140. In the scheme shown in FIG. 2B data storage system 100 uses the first set of error correction bits (ECC1) 120, the second set of error correction bits (ECC2) 130 without the flag bit 140. In the scheme shown in FIG. 2C data storage system 100 uses the first set of error correction bits (ECC1) 120 and the flag bit 140 without the second set of error correction bits (ECC2) 130.

Figure 3:
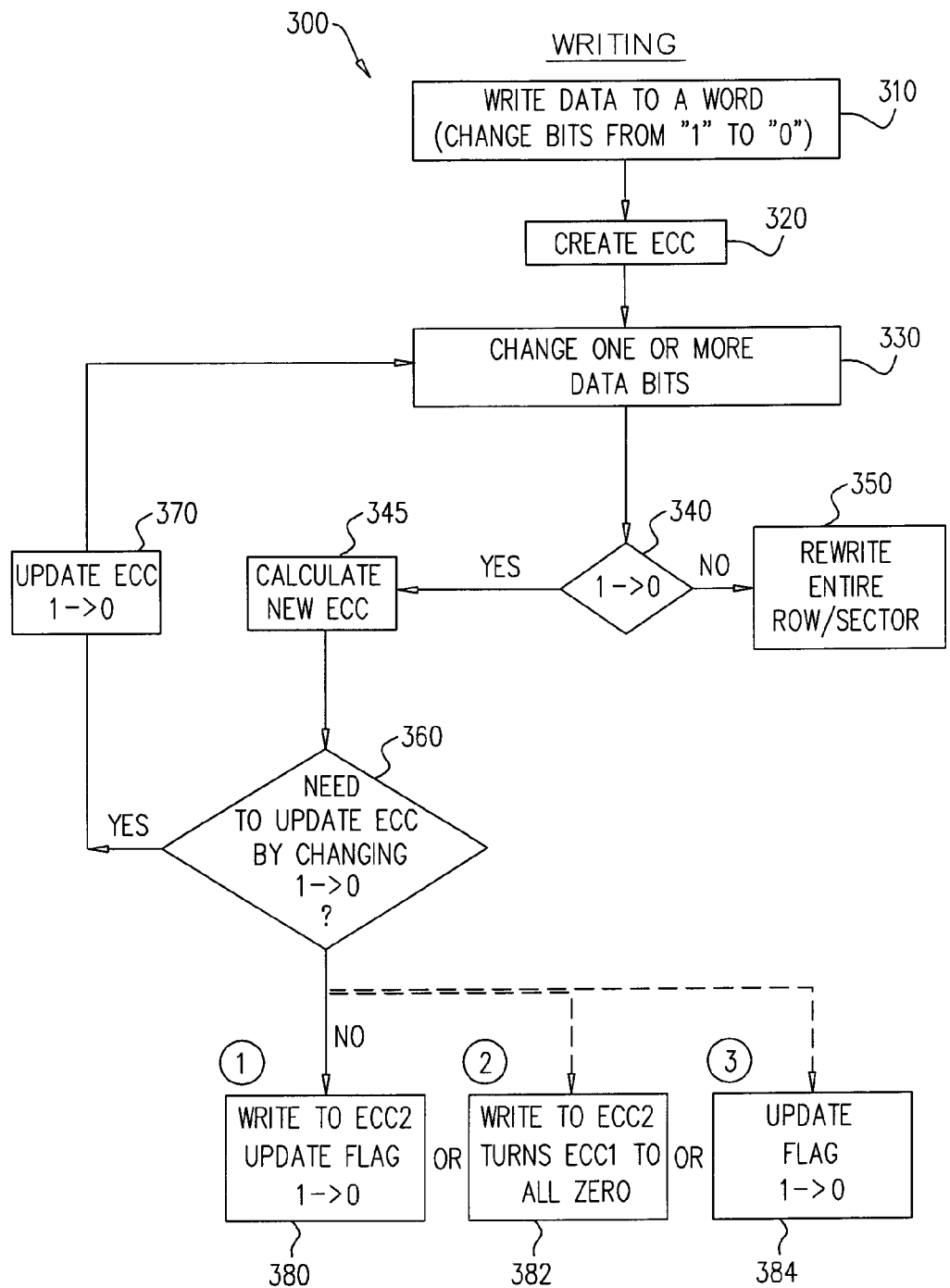
FIG. 3 is a flow diagram of a method of writing data to a data storage system, according to an exemplary embodiment of the disclosure.

FIG. 3 is a flow diagram of a method (300) of writing data to data storage system 100 using one of the three error correction code schemes shown in FIGS. 2A to 2C. Accordingly, each row 107 includes a word 110, the first set of error correction bits (ECC1) 120 and the second set of error correction bits (ECC2) 130 or the flag bit 140 or both the second set of error correction bits (ECC2) 130 and the flag bit 140.

Optionally, when initially writing (310) data to a word 110 the first set of error correction bits 120 is created (320) by calculating a code value based on an error correction code (e.g. Hamming or BCH). Afterwards, if the data in word 110 is updated by changing (330) bits that were previously written from the second state to the first state (e.g. '0' to '1'), then an entire row/sector needs to be rewritten (350). Alternatively, if the data update (330) only changes bits from the first state to the second state (e.g. '1' to '0' (340)), then only the specific bits need to be toggled and the entire row 107 does not need to be rewritten. In either case, a new error correction code needs to be calculated (345) from the updated word 110. If the new error correction code only requires updating (360) the error correction code by changing bits from the first state to the second state, then the first error correction code is updated (370) and new data updates may be applied to word 110 without rewriting an entire row 107/sector.

However, if the new error correction code requires updating bits from the second state to the first state then one of the three schemes is implemented to prevent the need to rewrite the entire row 107. In the first scheme (shown by FIG. 2A) the new error correction code is written (380) to the second set of error correction bits 130 and the flag bit 140 is updated from the first state to the second state. Accordingly, if the flag bit 140 is in the first state, the first error correction code 120 will be used for error correction, otherwise the second error correction code 130 will be used for error correction.

In the second scheme (shown by FIG. 2B) the new error correction code is written (382) to the second set of error correction bits 130. No flag bit is used so instead all the bits of the first set of error correction bits 120 are changed to the second state to indicate that the first set of error correction bits 120 is obsolete. When reading data, the first set of error correction bits 120 is checked to determine if it should be used or not. Optionally, the bits of the second set of error correction bits 130 are also checked to determine that they are not all in the first state, which would indicate that the second set of error correction bits 130 has not been used.

In the third scheme (shown by FIG. 2C) the new error correction code is discarded since it cannot be written to the first set of error correction bits 120 without rewriting the entire row 107/sector. However the flag bit 140 is used to provide indication if the content of the first set of error correction bits 120 is a valid error correction code or if the content of word 110 has been changed and the first set of error correction bits 120 is not relevant. Optionally, flag bit 140 is updated (384), so that when flag bit 140 is in the first state the first set of error correction bits 120 is used for error correction and when flag bit 140 is in the second state the first set of error correction bits 120 is not used.

Figure 5:
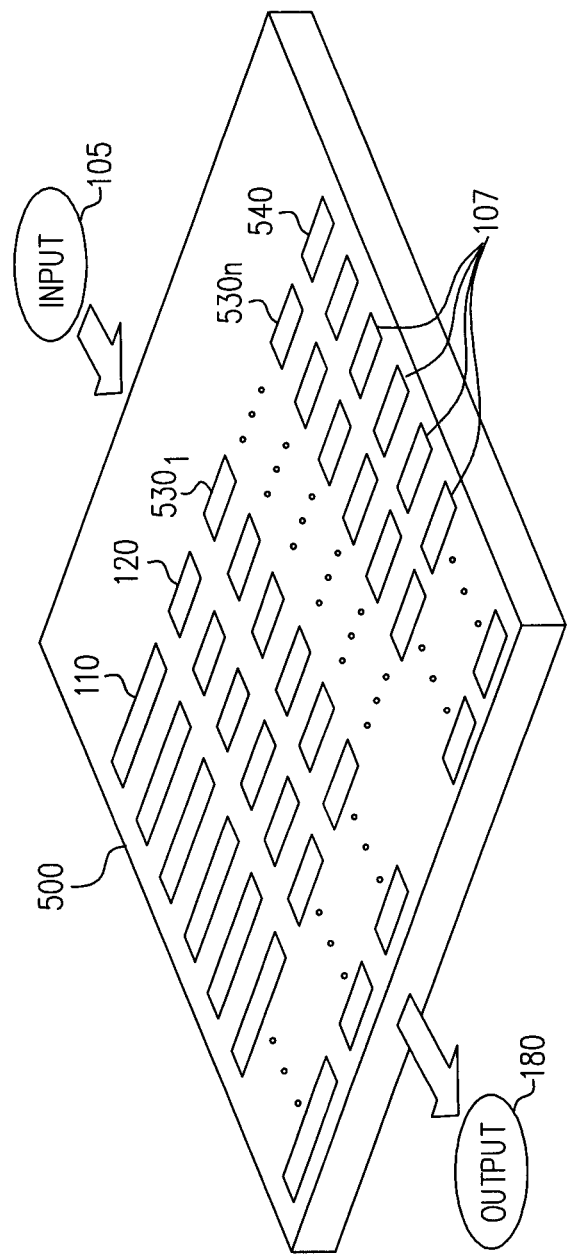
FIG. 5 is a schematic illustration of an alternative data storage system, according to an exemplary embodiment of the disclosure.

In some embodiments of the disclosure, data storage system 100 includes multiple sets of error correction bits, for example a first set of error correction bits 120 and one or more additional sets (e.g. N sets $530_1$ to $530_N$ of error correction bits), for example as shown in FIG. 5 as data storage system 500. Optionally, according to the first scheme a flag 540 includes N bits (instead of a single bit) to specify, which set of error correction bits $530_i$ is active. Optionally, a flag bit in the first state indicates that the corresponding set of error correction bits $530_1$ has not been used and a flag bit in the second state indicates that the corresponding set of error correction bits $530_i$ has been used. Optionally, the last set $530_i$ used is the current and correct set. Optionally, according to the second scheme, the active set of error correction bits will be identified based on the content of the sets of error correction bits (120 or $530_i$) Inactive sets of error correction bits (120 or $530_i$) will be set entirely to the second state whereas sets of error correction bits (120 or $530_i$) that have not been used will be set entirely to the first state. The current set of error correction bits (120 or $530_i$) will generally contain a mixture of bits in the first state and in the second state.

In an exemplary embodiment of the disclosure, a combination of schemes may be used, for example scheme one or scheme two may be used with N extra sets of error correction bits $530_i$, however if the sets are used up then the sets of error correction bits will be regarded as invalid as in scheme three unless the entire row 107/sector is rewritten.

Figure 4:
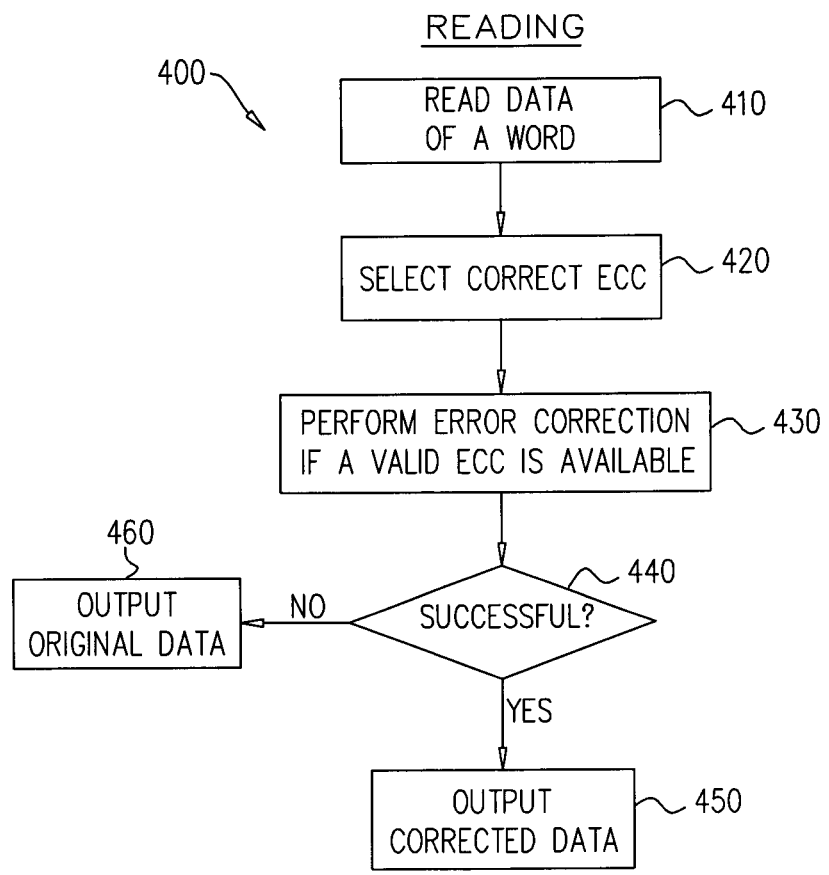
FIG. 4 is a flow diagram of a method of reading data from a data storage system, according to an exemplary embodiment of the disclosure.

FIG. 4 is a flow diagram of a method (400) of reading data from data storage system 100, according to an exemplary embodiment of the disclosure. Optionally, when a user accesses data storage system 100 to read (410) data from a word 110 the data is extracted with a selected (420) error correction data according to the error correction schemes described above. In an exemplary embodiment of the disclosure, when using the first scheme shown in FIG. 2A, a first selector 150 receives the flag bit 140 that is used to select if to transfer the first set of error correction bits 120 or the second set of error correction bits 130. Optionally, the selected (420) error correction data is provided to an error correction processor 160 with the data from word 110. Error correction processor 160 performs (430) an error correction algorithm to produce corrected data for the content of word 110. Optionally, the processor 160 also provides an indication if the error correction was successful or if the correction process failed, for example because of lack of a valid error correction code, or because too many errors were detected and correction was not possible. Optionally, a second selector 170 receives the uncorrected data from word 110 and the corrected data from processor 160. Then if the error correction process was successful (440) data storage system 100 provides the corrected data (450) as output 180. Otherwise data storage system 100 provides the original uncorrected data (460) as output 180.

In an exemplary embodiment of the disclosure, when using the second scheme shown in FIG. 2B, first selector 150 receives the first set of error correction bits 120 and the second set of error correction bits 130. Optionally, first selector 150 determines if all the bits of the first set of error correction bits 120 are in the second state (indicating that the first set of error correction bits 120 were erased) and responsive to the determination transfers the error correction code from the first set of error correction bits 120 or the second set of error correction bits 130. In some embodiments of the disclosure, first selector 150 may additionally determine if all the bits of the second set of error correction bits are all in the first state (indicating that the second set of error correction bits 130 has not been used). Optionally, first selector 150 transfers an error correction code based on one or both of the determinations.

Optionally, the selected (420) error correction code is provided to error correction processor 160 with the uncorrected data from word 110. Error correction processor 160 performs (430) an error correction algorithm to produce corrected data for the content of word 110. Optionally, the error correction processor 160 also provides an indication if the error correction was successful or if the correction process failed, for example because of lack of a valid error correction code, or because too many errors were detected and correction was not possible. Optionally, a second selector 170 receives the uncorrected data from word 110 and the corrected data from error correction processor 160. Then if the error correction process was successful (440) data storage system 100 provides the corrected data (450) as output 180. Otherwise data storage system 100 provides the original uncorrected data (460) as output 180.

In an exemplary embodiment of the disclosure, when using the third scheme shown in FIG. 2C only the first set of error correction bits 120 are available and are selected (420) to be provided to error correction processor 160. Optionally, flag bit 140 is also provided to error correction processor 160 to provide an indication if the content of the first set of error correction bits 120 constitute a valid error correction code. Optionally, if flag bit 140 is in the first state the content is valid and if flag bit is in the second state then the content is invalid since word 110 was updated and the first set of error correction bits 120 were not corrected to prevent rewriting the entire row 107.

In an exemplary embodiment of the disclosure, error correction processor 160 receives the data of word 110 with the content of the first set of error correction bits 120 and the flag bit 140. If the content of the first set of error correction bits 120 is valid (as indicated by flag bit 140) then error correction processor 160 performs (430) the error correction algorithm to produce corrected data for the content of word 110. Optionally, error correction processor 160 also provides an indication if the error correction was successful (440) and the corrected data should be used instead of the original uncorrected data of word 110. Optionally, a second selector 170 receives the uncorrected data from word 110 and the corrected data from processor 160 and the indication to select if to provide the original data (460) as output 180 or to provide the corrected data (450) as output 180.

In an exemplary embodiment of the disclosure, N sets of error correction bits may be used as explained above. Optionally, first selector 150 is configured to select the current set of error correction bits based on the flag bits or based on the content of the sets of error correction bits.

It should be appreciated that the above described methods and apparatus may be varied in many ways, including omitting or adding steps, changing the order of steps and the type of devices used. It should be appreciated that different features may be combined in different ways. In particular, not all the features shown above in a particular embodiment are necessary in every embodiment of the disclosure. Further combinations of the above features are also considered to be within the scope of some embodiments of the disclosure. It will also be appreciated by persons skilled in the art that the present disclosure is not limited to what has been particularly shown and described hereinabove.

I claim:

1. A method of enhancing error correction in a data storage system, comprising:
    receiving a data storage system having one or more rows each row having: a set of data bits including a word of data, a first set of error correction bits and a second set of error correction bits or a flag bit or both; each bit can be in a first state or a second state; wherein initially all the bits are in the first state;
    writing data in a word in the data storage system by changing bits from the first state to the second state;
    creating an error correction code for the word and writing the error correction code to the first set of error correction bits;
    receiving a request to update the word by changing one or more additional bits of the word from the first state to the second state;
    calculating a new error correction code for the updated word; and
    performing one of the following options:
    a) writing the new error correction code to the second set of error correction bits and changing the value of the flag bit from the first state to the second state; or
    b) writing the new error correction code to the second set of error correction bits and changing the value of all the bits of the first set of error correction bits to the second state; or
    c) discarding the new error correction code and changing the value of the flag bit from the first state to the second state; or
    d) determining if the new error correction code only requires changing bits of the first set of error correction bits from the first state to the second state, and updating the first set of error correction bits if the determination is positive.

2. The method according to claim 1, further comprising:
    reading data of a word from the data storage system;
    selecting a set of error correction bits based on the content of the flag bit or the content of the first set of error correction bits;
    performing error correction if a valid error correction code is available in the first set of error correction bits or in the second set of error correction bits;
    if error correction is successful, providing corrected data instead of the data read from the word;
    otherwise if error correction is unsuccessful, providing the uncorrected data read from the word.

3. The method according to claim 2, further comprising providing an indicator whether the provided data read from the word was corrected successfully, or not corrected due to failure, lack of error in the original word, or lack of valid error correction bits.

4. The method according to claim 2, wherein said selecting comprises:
    using the first set of error correction bits if the flag bit is in the first state and using the second set of error correction bits if the flag bit is in the second state.

5. The method according to claim 2, wherein said selecting comprises:
    using the second set of error correction bits if all the bits of the first set of error correction bits are in the second state, otherwise using the first set of error correction bits.

6. The method according to claim 2, wherein said selecting comprises:
    using the second set of error correction bits if all the bits of the first set of error correction bits are in the second state and not all of the bits of the second set of error correction bits are in the first state, otherwise using the first set of error correction bits.

7. The method according to claim 2, wherein said selecting comprises:
    using the first set of error correction bits if the flag bit is in the first state and the second set of error correction bits does not exist, otherwise if the flag bit is in the second state not performing error correction.

8. The method according to claim 1, wherein changing a bit of a word from the second state to the first state requires erasing one or more entire rows and rewriting them with the required change.

9. A data storage system, comprising:
    One or more rows each row having: a set of data bits including a word of data, a first set of error correction bits and a second set of error correction bits or a flag bit or both; each bit can be in a first state or a second state; wherein initially all bits are in the first state;
    wherein the data storage system is configured to write data in a word by changing bits from the first state to the second state and then creating an error connection code for the word and writing the error correction code to the first set of error correction bits;
    the data storage system is also configured to:
        receive a request to update the data of the word by changing additional bits of the word from the first state to the second state;
        calculate a new error correction code for the updated word; and
        perform one of the following options:
        a) write the new error correction code to the second set of error correction bits and changing the value of the flag bit from the first state to the second state; or
        b) write the new error correction code to the second set of error correction bits and changing the value of all the bits of the first set of error correction bits to the second state; or
        c) discard the new error correction code and changing the value of the flag bit from the first state to the second state; or
        d) determine if the new error correction code only requires changing bits of the first set of error correction bits from the first state to the second state, and updating the first set of error correction bits if the determination is positive.

10. The system of claim 9, wherein the system is configured to enable reading data of a word and correcting the data of the word by:
selecting a set of error correction bits based on the content of the flag bit and/or the content of the first set of error correction bits;
performing error correction if a valid error correction code is available in the first set of error correction bits or the second set of error correction bits;
if error correction is successful, providing corrected data instead of the data read from the word;
otherwise if error correction is unsuccessful providing the uncorrected data read from the word.

11. The system of claim 10, wherein the system also provides an indicator whether the provided data read from the word was corrected successfully, or not corrected due to failure, lack of error in the original word, or lack of valid error correction bits.

12. The system of claim 10, wherein said selecting comprises:
using the first set of error correction bits if the flag bit is in the first state and using the second set of error correction bits if the flag bit is in the second state.

13. The system of claim 10, wherein said selecting comprises:
using the second set of error correction bits if all the bits of the first error correction bits are in the second state, otherwise using the first set of error correction bits.

14. The system of claim 10, wherein said selecting comprises:
using the second set of error correction bits if all the bits of the first error correction bits are in the second state and not all of the bits of the second set of error correction bits are in the first state, otherwise using the first set of error correction bits.

15. The system of claim 10, wherein said selecting comprises:
using the first set of error correction bits if the flag bit is in the first state and the second set of error correction bits does not exist, otherwise if the flag bit is in the second state not performing error correction.

16. The system of claim 9, wherein changing a bit of a word from the second state to the first state requires erasing one or more entire rows and rewriting them with the required change.

17. The system of claim 9, wherein each row comprises more than two sets of error correction bits.

* * * * *